United States Patent
Rekhi et al.

(10) Patent No.: US 11,756,814 B1
(45) Date of Patent: Sep. 12, 2023

(54) VERTICAL POLISHING SYSTEM WITH MULTIPLE DEGREES OF FREEDOM

(71) Applicant: META PLATFORMS, INC., Menlo Park, CA (US)

(72) Inventors: Sandeep Rekhi, San Jose, CA (US); Pradip Sairam Pichumani, Bellevue, WA (US)

(73) Assignee: META PLATFORMS, INC., Menlo Park, CA (US)

( * ) Notice: Subject to any disclaimer, the term of this patent is extended or adjusted under 35 U.S.C. 154(b) by 163 days.

(21) Appl. No.: 17/332,794

(22) Filed: May 27, 2021

(51) Int. Cl.
  *B24B 37/00* (2012.01)
  *H01L 21/67* (2006.01)
  *B24B 37/34* (2012.01)
  *B24B 37/24* (2012.01)

(52) U.S. Cl.
  CPC ...... *H01L 21/67219* (2013.01); *B24B 37/245* (2013.01); *B24B 37/34* (2013.01)

(58) Field of Classification Search
  CPC ....... B24B 37/245; B24B 37/27; B24B 37/34; B24B 53/017; B24B 57/02; H01L 21/67219
  See application file for complete search history.

(56) References Cited

U.S. PATENT DOCUMENTS

| | | | | |
|---|---|---|---|---|
| 3,680,268 A | * | 8/1972 | Lorton | B24B 41/066 451/380 |
| 3,881,888 A | * | 5/1975 | Schwab | B24B 3/36 451/367 |
| 4,132,318 A | * | 1/1979 | Wang | B25J 9/0015 414/21 |
| 6,193,587 B1 | * | 2/2001 | Lin | B24B 53/12 451/287 |
| 6,926,596 B1 | * | 8/2005 | Tarris | B24B 3/38 451/367 |
| 8,500,515 B2 | | 8/2013 | Duesher | |
| 8,696,405 B2 | * | 4/2014 | Duescher | B24B 7/22 451/5 |

(Continued)

FOREIGN PATENT DOCUMENTS

JP  10296618 A  * 11/1998  ........... B24B 37/107

OTHER PUBLICATIONS

Chandra et al., "Chemical Mechanical Paired Grinding: a Tool for Multi-Wavelength Planarization", Mar. 2017, International Journal of Advanced Manufacturing Technology. vol. 89, pp. 611-617.

(Continued)

*Primary Examiner* — Joel D Crandall
*Assistant Examiner* — Alyssa R Williams
(74) *Attorney, Agent, or Firm* — Mannava & Kang, P.C.

(57) ABSTRACT

A system for polishing a sample is provided. The system may comprise a motor. The system may also include a polishing element that is actuated by the motor. The system may also have a sample holder. The sample holder may hold a sample to be polished by the polishing element. In some examples, the sample holder has multiple degrees of movement in order to precisely polish, grind, or bevel the sample. In some examples, the system may further include an arm having a slurry dispenser, inlets for fluid, and a squeegee-like element to clean, wash, or brush off debris from the polishing element during a polishing process.

20 Claims, 6 Drawing Sheets

(56) References Cited

U.S. PATENT DOCUMENTS

| 8,795,029 | B2 | 8/2014 | Birang et al. | |
|---|---|---|---|---|
| 2006/0035562 | A1* | 2/2006 | Sarfati | G02B 6/3863 |
| | | | | 451/41 |
| 2014/0030967 | A1* | 1/2014 | Hart | G01N 1/286 |
| | | | | 451/364 |
| 2018/0093361 | A1* | 4/2018 | Yamanaka | B24B 37/34 |
| 2018/0264619 | A1* | 9/2018 | Yoshida | B24B 49/105 |

OTHER PUBLICATIONS

Nam, Jamie, "Optical Endpoint Detection for the Chemical Mechanical Polishing Process", Jan. 2000, Master of Science in Mechanical Engineering, Massachusetts Institute of Technology.

Mohsin et al, "Optimization of the Polishing Efficiency and Torque by Using Taguchi Method and ANOVA in Robotic Polishing", Jan. 23, 2020, Applied Sciences. vol. 10, No. 3, Article 824, pp. 1-15.

SPM-2: Grinding of Spheres, Aspheres and Freeform Surfaces, https://www.youtube.com/watch?v=I0PRI4EmppA&feature=emb_rel_end.

LP70 Multi-Station Precision Lapping & Polishing System, https://www.youtube.com/watch?v=8fFtO5MA6Hs.

* cited by examiner

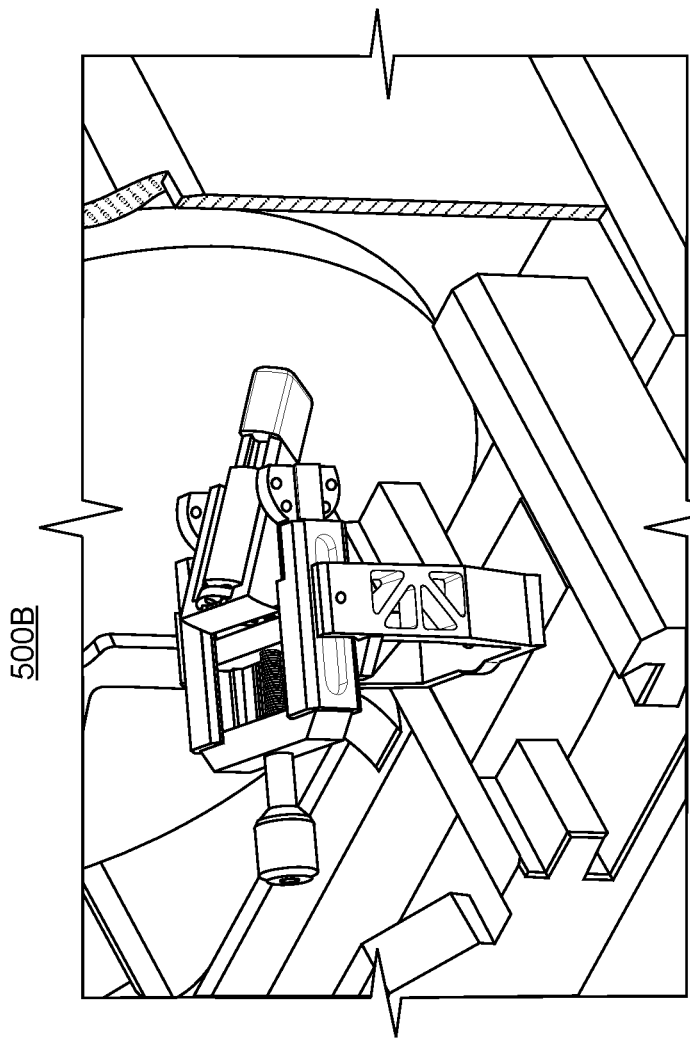
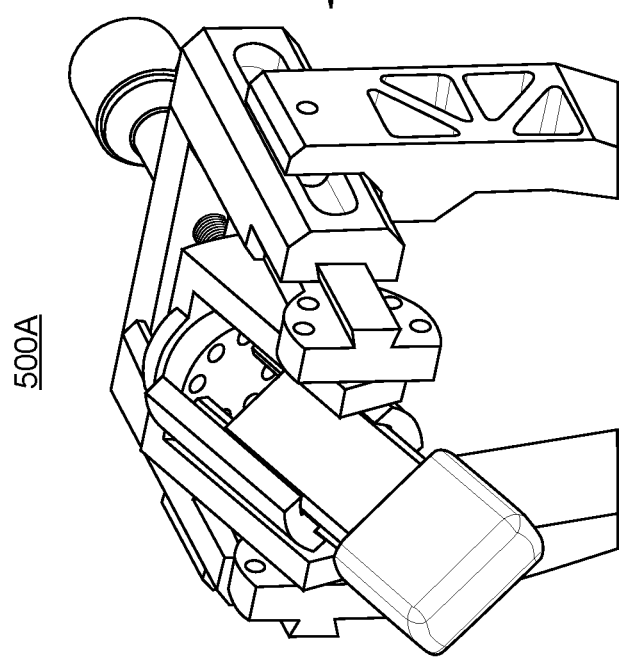
FIG. 5A
FIG. 5B

VERTICAL POLISHING SYSTEM WITH MULTIPLE DEGREES OF FREEDOM

TECHNICAL FIELD

This patent application is directed to in-situ polishing instrument and equipment for semiconductors or optoelectronic components, and more specifically, to techniques for polishing optoelectronic components using a vertical mechanical polisher with multiple degrees of freedom.

BACKGROUND

Semiconductors and other various electrical and optical components are used in a variety of devices, systems, and instrumentation. In order to manufacture, inspect, or repair these types of components, polishing systems, tools, or processes may be employed. However, as such components become smaller or where greater precision is required, conventional polishing systems and methods may not be equipped to provide, among other things, precision beveling, performance testing in-situ without repeat mounting or dismounting o samples, or automatic real-time cleaning of polishing surfaces.

BRIEF DESCRIPTION OF DRAWINGS

Features of the present disclosure are illustrated by way of example and not limited in the following Figure(s), in which like numerals indicate like elements, in which:

FIGS. 5A-5B illustrate views of the holder used by the system depicting real-time operation with the vertical mechanical polisher, according to an example.

DETAILED DESCRIPTION

For simplicity and illustrative purposes, the present disclosure is described by referring mainly to examples and embodiments thereof. In the following description, numerous specific details are set forth in order to provide a thorough understanding of the present disclosure. It will be readily apparent, however, that the present disclosure may be practiced without limitation to these specific details. In other instances, some methods and structures readily understood by one of ordinary skill in the art have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

There are many types of polishers, which may be used for polishing, grinding, or beveling. However, conventional polishers usually have a polishing surface that is horizontal and lack multiple degrees of freedom, in terms of movement for a sample to be polished. Furthermore, conventional polishing solutions lack the ability to inspect the sample in-situ in real-time, and often require an operator of the polisher to mount and remount the sample, adjust the sample holder, and remount the sample in order to polish the sample in a more refined or granular way. Thus, in order to manufacture, inspect, or polish components that are small, such as semiconductor or optoelectronic components, the systems and methods described herein provide precision polishing/grinding/beveling in such a way that an operator can perform tests or inspections in-situ without repeated mounting or dismounting of samples by using a system with vertical polisher and a sample holder that has multiple degrees of freedom.

Figure 1:
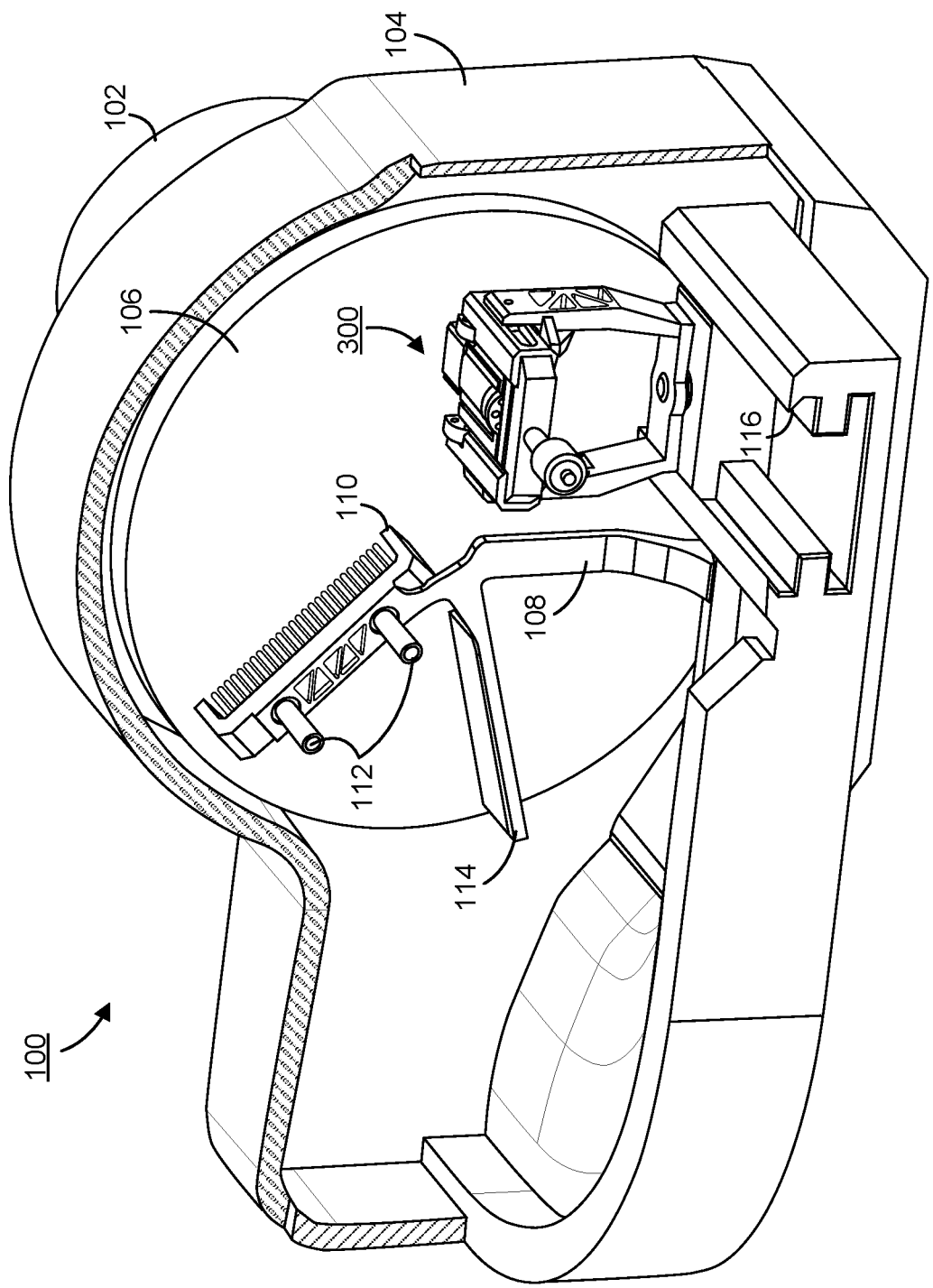
FIG. 1 illustrates a planar view of a system for polishing optoelectronic components using a vertical mechanical polisher with multiple degrees of freedom, according to an example.

FIG. 1 illustrates a planar view of a system 100 for polishing optoelectronic components using a vertical mechanical polisher with multiple degrees of freedom, according to an example. The system 100 may include a motor 102, an enclosure 104 housing a polishing element 106 for polishing an optoelectronic component. The system 100 may also include an arm 108, which may include a slurry dispenser 110 with one or more inlets 1112, and a squeegee-like element 114. The system 100 may also include a sample holder 300 that is capable of sliding on a slider 116 of the system 100. As described in more detail below, the system 100 may allow an operator to perform in-situ inspection of a cross section of a sample, in real-time, during a polishing process.

The motor 102 may include any type of rotary motor. The motor 102 may be coupled to the polishing element 106 and cause it to spin in a forward or backward (clockwise or counter-clockwise) direction. It should be appreciated that the motor 102 may include any number of varying speed (RPM) motors. Other various examples may also be provided.

The enclosure 104 may provide protective housing for the polishing element 106 and other various components of the system 100, such as the arm, sample holder 300, or other electronic components needed for operation of the system. In some examples, the enclosure 104 may be made of or include steel, and the arm 108 and/or sample holder 300 may be made of or include aluminum, anodized steel, and/or other types of high grade (precision) steel or steel-like material. Other materials may also be provided.

The polishing element 106 may be a vertical polishing wheel, as shown. Although a horizontal configuration may be provided, a vertical polishing wheel may provide several notable advantages and benefits in this system 100. For example, the vertical nature of the polishing element 106 may allow debris to more easily fall or be brushed off, ultimately reducing the amount of debris that could interfere and therefore allow for a more precise and thorough polishing process.

In some examples, the surface of the polishing element 106 may support any number of swappable grinding or polishing pads. For example, these may include 80-2000 grit silicon carbide (SiC) based pads, with water (or other fluid) to clean the pads and/or act as a lubricant). Other materials may be used as well, such as polishing cloth or felt pads. In some examples, the polishing cloth or felt pads may be supported with diamond suspensions, e.g., approximately 12 µm-0.05 µm particle size. In addition or alternatively, the polishing cloth or felt pads may be supported with silica or alumina suspensions, e.g., having 5 μm-0.02 μm particle size. These and other various polishing/grinding pads may be provided depending on application or samples used in the system 100.

The arm 108 may be attached to the enclosure 104 or a base within the enclosure 104. As shown, the arm 108 may include any number of components, such as a slurry dispenser 110 and/or a squeegee-like element 114, which together may work to brush off or clean the surface of the polishing element 106. The slurry dispenser 110 may further include any number of bristles and/or inlets 112 to dispense slurry, water, lubricant, or other liquid, fluid, or gas to clean the surface of the polishing element 106 or facilitate the polishing process. The bristles, for example, may be made of nylon or the synthetic brush-like material to more easily collect and/or brush off debris or slurry. In some examples, the squeegee-like element 114 may be made of any number of flexible material, such as rubber or rubber-like material, that does not leave or minimizes residue.

The sample holder 300 may be provided in the system 100. In some examples, the sample holder 300 may hold a sample to be polished/grinded by the polishing element 106 of the system 100. The sample holder 300 may be configured to and capable of sliding on a slider 116 at the of the system 100. This may allow coarse movement toward and away from the surface of the polishing element 106. Details of the sample holder 300 will be described in more detail with regard to FIGS. 3 and 4A-4E below.

Figure 2A:
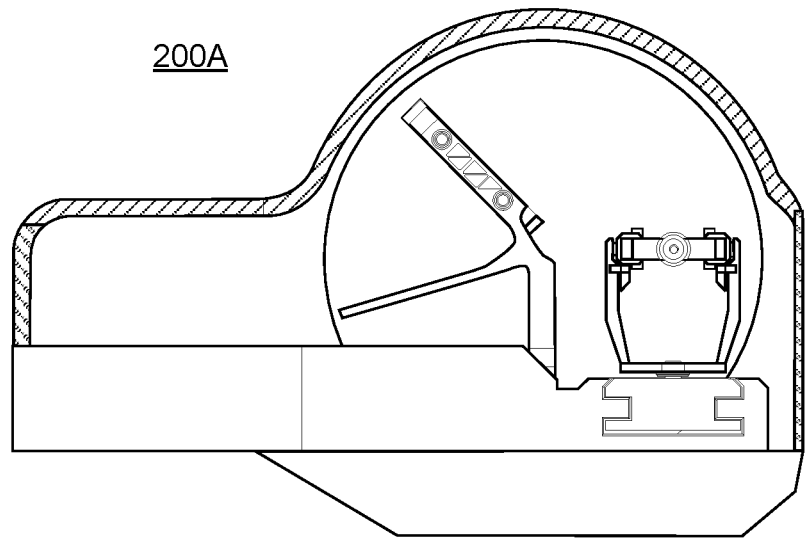
FIGS. 2A-2D illustrate various views of the system for polishing optoelectronic components using a vertical mechanical polisher with multiple degrees of freedom, according to an example.
Figure 2B:
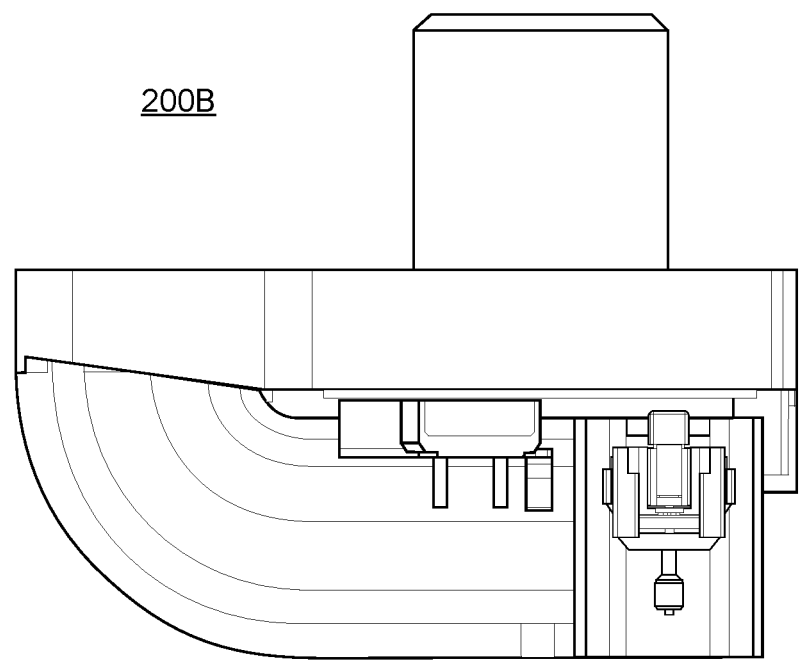
Figure 2C:
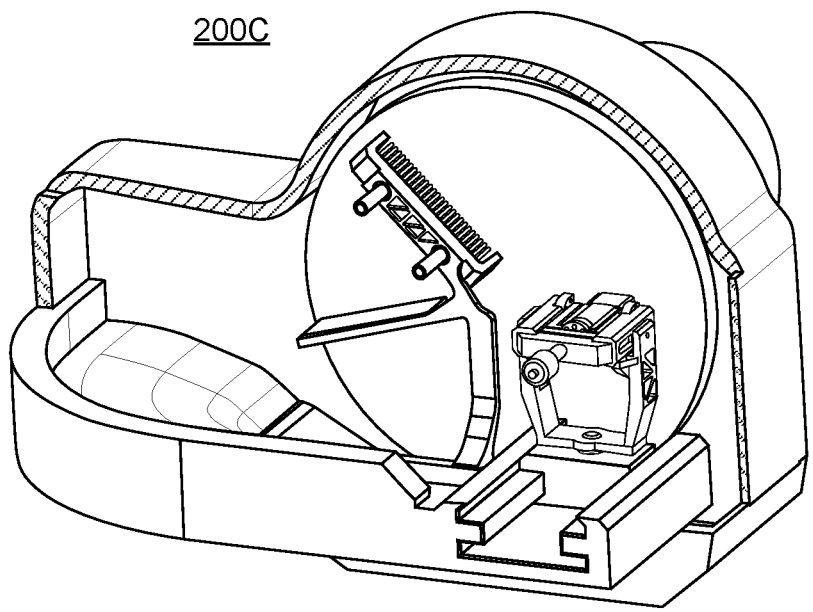
Figure 2D:
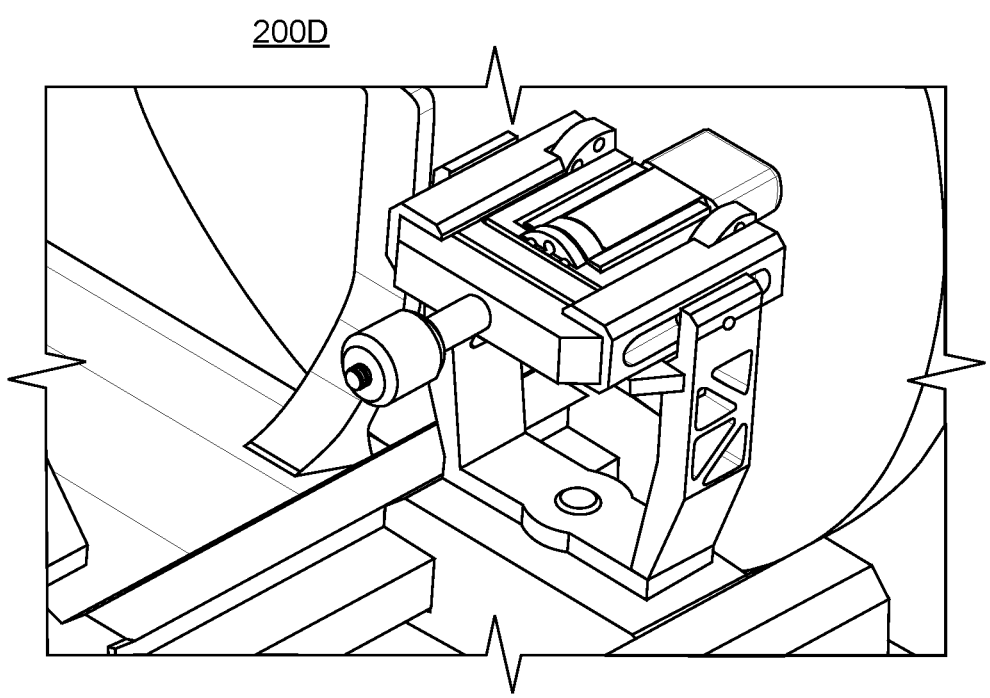

FIGS. 2A-2D illustrate various views 200A-200D of the system for polishing optoelectronic components using a vertical mechanical polisher with multiple degrees of freedom, according to an example. FIG. 2A illustrates a front view 200A of the system 100. FIG. 2B illustrates a top view 200B of the system 100. FIG. 2C illustrates an isometric view 200C of the system 100. FIG. 2D illustrates a close-up planar view 200D of the sample holder 300 used in the system 100.

Figure 3:
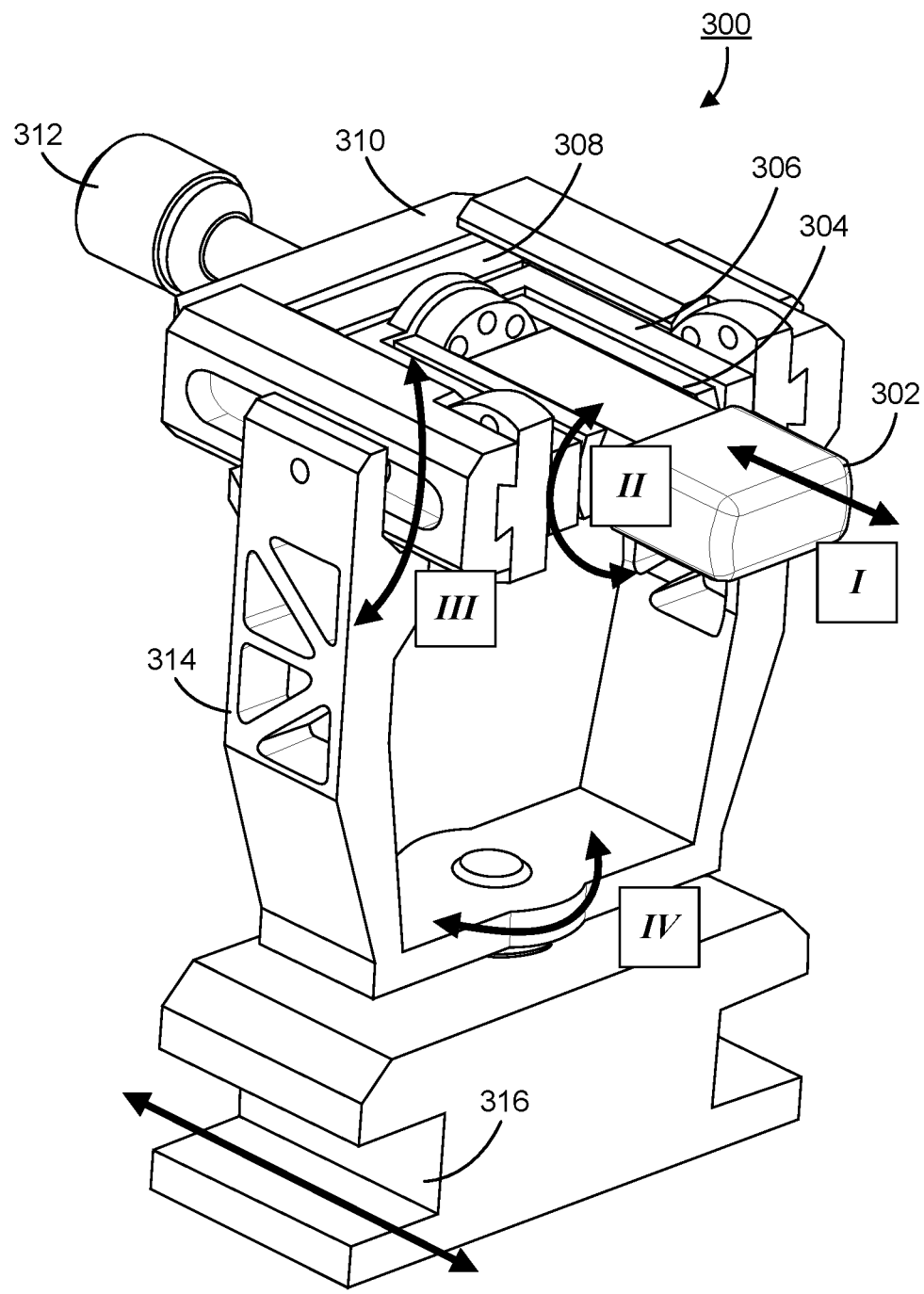
FIG. 3 illustrates a planar view of a holder used by the system for polishing optoelectronic components using a vertical mechanical polisher with multiple degrees of freedom, according to an example.

FIG. 3 illustrates a planar view of a sample holder 300 used by the system 100 for polishing optoelectronic components using a polishing element 106 with multiple degrees of freedom, according to an example. As shown, the sample holder 300 may include a sample mounting surface 302, several U-shaped components 304, 306, 308, and 310, a gauge 312, an adjustment component 314, and a groove 316 for sliding at the base of the system 100 and allow for coarse movement toward or away from the surface of the polishing element 106.

The sample mounting surface 302 may provide a surface to which a sample may be mounted. In some examples, the sample may be adhered to the sample mounting surface 302 with any number of adhesives. For example, these may include epoxy, glue, tape, or other chemical, mechanical, or magnetic techniques. It should be appreciated that the sample may include any number of electrical, optical, or mechanical components used in a variety of devices, apparatuses, and systems. In some examples, the samples may be optoelectronic components used in optoelectronic systems, such as semiconductors or optical telecommunication systems.

The U-shaped components 304, 306, 308, and 310 may include a first inner U-shaped component 304, a second inner U-shaped component 306, a third inner U-shaped component 308, and a main (outer) U-shaped component 310. These U-shaped components 304, 306, 308, and 310, together with the gauge 312 and adjustment component 314, may allow the sample holder 300 to perform any number of coarse or fine motions for precise and accurate polishing of the sample. These movements will be described in more detail in conjunction with various views depicted in FIGS. 4A-4E, which illustrate various views of the sample holder 300 used by the system 100 with multiple degrees of freedom, according to an example.

Figure 4C:
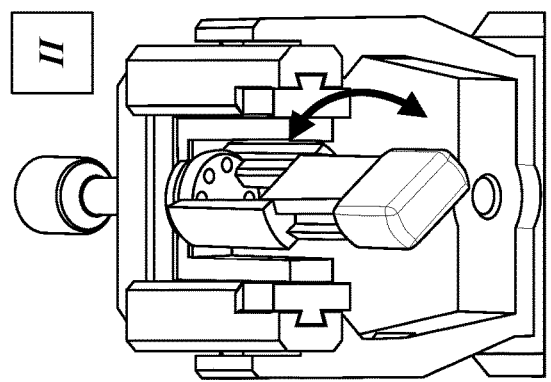
FIGS. 4A-4E illustrate views of the holder used by the system with multiple degrees of freedom, according to an example.
Figure 4B:
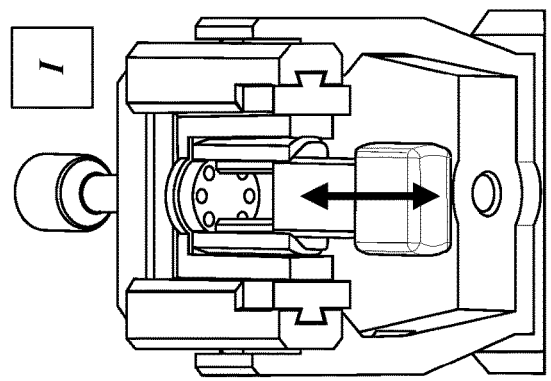
Figure 4A:
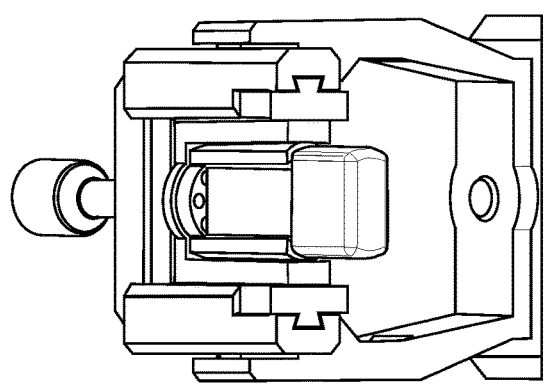

FIG. 4A may illustrate the sample holder 300 in a static position. The sample mounting surface 302 may be extendible or retractable, providing movement in the/direction, as shown in FIG. 3 and FIG. 4B. Such movement may be referred to as rectilinear (forward or backward) movement.

In some examples, the first inner U-shaped component 304 allow the sample mounting surface 302 to move in the II direction, as shown in FIG. 3 and FIG. 4C. Such movement may be referred to as a first angular (rotation in a first plane) movement.

Figure 4E:
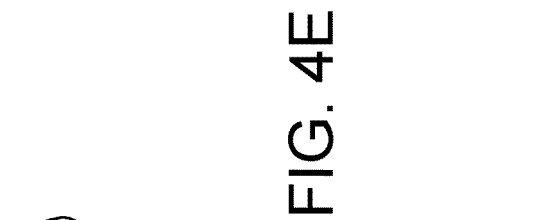
Figure 4D:
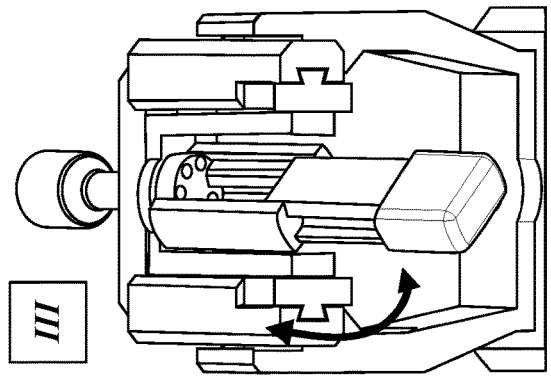

In some examples, the second inner U-shaped component 306 may allow the sample mounting surface 302 to move in the III direction, as shown in FIG. 3 and FIG. 4D. Such movement may be referred to as a second angular (tilt) movement.

In some examples, the adjustment component 314 may allow the sample mounting surface 302 to move in the IV direction, as shown in FIG. 3 and FIG. 4E. Such movement may be referred to as a third angular (rotation in a second plane) movement. In some examples, the second plane may be perpendicular to the first plane.

It should be appreciated that these movements may be provided by actuated by any type of actuation techniques. In some examples, these may be mechanically operated by an operator. In some examples, the actuation techniques may be facilitated and coordinated by electronic or computer-enabled techniques. In this way, the sample holder 300 may allow the sample to be manipulated in multiple degrees of freedom, and therefore any number of positions, to be polished by the polishing element 106 of the system 100.

For example, FIGS. 5A-5B illustrate views 500A-500B of the sample holder 300 used by the system 100 depicting real-time operation with the polishing element 106, according to an example. FIG. 5A illustrates the sample holder 300 in a position 500A that exercises multiple degrees of movement. FIG. 5B illustrates the sample holder 300 brought in a position 500B that is near to the surface of the polishing element 106 of the system 100. As shown, this may enable any sample to be manipulated and polished in a precise manner.

Advantages and benefits of the systems and methods described herein are readily apparent. For example, the systems and methods using vertical polisher 106 and the sample holder 300 described herein may allow for precision polishing, grinding, or beveling. Furthermore, the systems and methods described herein may allow for cleaner polishing surfaces, which provide more accurate polish or grind. Also, the nature and design of the system, with the multiple freedom of movement of the sample holder, may allow accurate movement and in-situ inspection during real-time operation.

While examples described herein are directed to configurations as shown, it should be appreciated that any of the components described or mentioned herein may be altered, changed, replaced, or modified, in size, shape, and numbers, or material, depending on application or use case, and adjusted for desired resolution or optimal measurement results.

It should be appreciated that the systems and methods described herein may optimize movement and reduce debris, thereby facilitating more reliable and precise polishing/grinding/beveling of various samples. It should also be appreciated that the systems and methods, as described herein, may also include or communicate with other components not shown. For example, these may include external processors, counters, analyzers, computing devices, and other measuring devices or systems. This may also include middleware (not shown) as well. The middleware may include software hosted by one or more servers or devices. Furthermore, it should be appreciated that some of the middleware or servers may or may not be needed to achieve functionality. Other types of servers, middleware, systems, platforms, and applications not shown may also be provided at the back-end to facilitate the features and functionalities of the system.

Moreover, single components may be provided as multiple components, and vice versa, to perform the functions and features described herein. For example, although slurry dispenser 110 (or other element) may be shown in the system 100, two more slurry dispensers (or optical elements) may also be provided to achieve a similar or improved result. It should be appreciated that the components of the system described herein may operate in partial or full capacity, or it may be removed entirely. It should also be appreciated that analytics and processing techniques described herein with respect to the operation of the system, for example, may also be performed partially or in full by other various components of the overall system.

It should be appreciated that data stores may also be provided to the apparatuses, systems, and methods described herein, and may include volatile and/or nonvolatile data storage that may store data and software or firmware including machine-readable instructions. The software or firmware may include subroutines or applications that perform the functions of the measurement system and/or run one or more application that utilize data from the measurement or other communicatively coupled system.

The various components, circuits, elements, components, and interfaces, may be any number of mechanical, electrical, hardware, network, or software components, circuits, elements, and interfaces that serves to facilitate communication, exchange, and analysis data between any number of or combination of equipment, protocol layers, or applications. For example, the components described herein may each include a network or communication interface to communicate with other servers, devices, components or network elements via a network or other communication protocol.

Although examples are directed to polishing systems, it should be appreciated that the systems and methods described herein may also be used in other various systems and other implementations as well. There may be numerous applications in optical communication networks, semiconductor fabrication, and mechanical processing that could employ the systems and methods as well.

What has been described and illustrated herein are examples of the disclosure along with some variations. The terms, descriptions, and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

The invention claimed is:

1. A system, comprising:
   a motor;
   a polishing pad holder that is actuated by the motor, wherein the polishing pad holder comprises a surface to hold a grinding or polishing pad; and
   a sample holder to hold a sample to be polished by the grinding or polishing pad attached to the surface of the polishing pad holder, wherein the sample holder comprises:
      a mounting surface component to hold the sample, wherein the mounting surface component is extendible or retractable to move the sample toward or away from the polishing pad holder,
      a first U-shaped component attached to an outside wall of the mounting surface component and rotatable around a first axis, perpendicular to the surface of the polishing pad holder, to allow the mounting surface component to rotate on the surface of the polishing pad holder,
      a second U-shaped component attached to an outside wall of the first U-shaped component and rotatable around a second axis, perpendicular to the first axis, to allow the mounting surface component to tilt up or down with respect to the surface of the polishing pad holder, and
      a third U-shaped component attached to an outside wall of the second U-shaped component and rotatable around a third axis, perpendicular to the first axis and the second axis, to allow the mounting surface component to tilt left or right with respect to the surface of the polishing pad holder.

2. The system of claim 1, wherein the motor is rotary motor.

3. The system of claim 1, wherein the surface of the polishing pad holder is substantially vertical with respect to a horizontal plane.

4. The system of claim 1, wherein the outside wall of the mounting surface component comprises a groove attached to the first U-shaped component to allow the mounting surface component to be extendible or retractable.

5. The system of claim 1, wherein the grinding or polishing pad comprises at least one of silicon carbide (SiC), diamond suspensions, or silica or alumina suspensions.

6. The system of claim 1, wherein a base of the sample holder is attached to a slider to slide the sample holder in a forward direction toward the polishing pad holder or in a backward direction away from the polishing pad holder.

7. The system of claim 6, wherein the base of the sample holder comprises a groove attached to the slider.

8. The system of claim 1, further comprising:
   a gauge, in a shape of a knob, attached to a base of the second U-shaped component to control movement of the second U-shaped component.

9. The system of claim 1, further comprising:
   an enclosure to house the polishing pad holder; and
   an arm to clean debris from the polishing pad holder.

10. The system of claim 9, wherein the arm comprises:
    a slurry dispenser having bristles and at least one inlet to dispense a fluid onto the polishing pad holder; and
    a squeegee-like element, which together with the bristles of the slurry dispenser, brushes or washes off loose debris from the polishing pad holder.

11. A method for polishing a sample, comprising:
    providing a polishing pad holder actuated by a rotary motor, wherein the polishing pad holder comprises a surface to hold a grinding or polishing pad; and
    providing a sample holder to hold the sample, wherein the sample is to be polished by the grinding or polishing pad attached to the surface of the polishing pad holder, wherein the sample holder comprises:
       a mounting surface component to hold the sample, a first U-shaped component attached to an outside wall of the mounting surface component and rotatable around a first axis, perpendicular to the surface of the polishing pad holder, to allow the mounting surface component to rotate on the surface of the polishing pad holder, a second U-shaped component attached to an outside wall of the first U-shaped component and rotatable around a second axis, perpendicular to the first axis, to allow the mounting surface component to tilt up or down with respect to the surface of the polishing pad holder, and a third U-shaped component attached to an outside wall of the second U-shaped component and rotatable around a third axis, perpendicular to the first axis and the second axis, to allow the mounting surface component to tilt left or right with respect to the surface of the polishing pad holder.

12. The method of claim 11, wherein the surface of the polishing pad holder is substantially vertical with respect to a horizontal plane.

13. The method of claim 11, wherein the outside wall of the mounting surface component comprises a groove attached to the first U-shaped component to allow the mounting surface component to be extendible or retractable.

14. The method of claim 11, wherein the grinding or polishing pad comprises at least one of silicon carbide (SiC), diamond suspensions, or silica or alumina suspensions.

15. The method of claim 11, further comprising:
attaching a base of the sample holder to a slider to slide the sample holder in a forward direction toward the polishing pad holder or in a backward direction away from the polishing pad holder.

16. The method of claim 15, wherein the base of the sample holder comprises a groove attached to the slider.

17. The method of claim 11, further comprising:
attaching a gauge, in a shape of a knob, to a base of the second U-shaped component to control movement of the second U-shaped component.

18. The method of claim 11, further comprising:
providing an enclosure to house the polishing pad holder; and
providing an arm to clean debris from the polishing pad holder.

19. The method of claim 18, wherein the arm comprises:
a slurry dispenser having bristles and at least one inlet to dispense a fluid onto the polishing pad holder; and
a squeegee-like element, which together with the bristles, brushes or washes off loose debris from the polishing pad holder.

20. A non-transitory computer-readable storage medium having instructions stored thereon, which when executed cause a processor to:
operate a rotary motor to actuate a polishing pad holder, wherein the polishing pad holder comprises a surface to hold a grinding or polishing pad; and
operate a sample holder holding a sample to be polished by the grinding or polishing pad attached to the surface of the polishing pad holder, wherein the sample holder comprises:
a mounting surface to hold the sample,
a first U-shaped component attached to an outside wall of the mounting surface and rotatable around a first axis, perpendicular to the surface of the polishing pad holder, to allow the mounting surface to rotate on the surface of the polishing pad holder,
a second U-shaped component attached to an outside wall of the first U-shaped component and rotatable around a second axis, perpendicular to the first axis, to allow the mounting surface to tilt up or down with respect to the surface of the polishing pad holder, and
a third U-shaped component attached to an outside wall of the second U-shaped component and rotatable around a third axis, perpendicular to the first axis and the second axis, to allow the mounting surface to tilt left or right with respect to the surface of the polishing pad holder.

* * * * *